United States Patent [19]

Hilligoss

[11] 4,418,250
[45] Nov. 29, 1983

[54] TELEPHONE CABLE SPLICERS TEST SET AND METHOD OF TESTING

[75] Inventor: Lawrence O. Hilligoss, Seal Beach, Calif.

[73] Assignee: Communications Technology Corporation, Los Angeles, Calif.

[21] Appl. No.: 330,439

[22] Filed: Dec. 14, 1981

[51] Int. Cl.³ .......................... H04B 3/46; G01R 31/08
[52] U.S. Cl. ....................... 179/175.3 R; 179/175.3 F; 324/51
[58] Field of Search .................. 179/175.3 R, 175.3 F; 324/51, 52, 57 R, 58 R, 60 CD; 371/22; 178/69 R, 69 N, 63 R

[56] References Cited

U.S. PATENT DOCUMENTS 3,944,914  3/1976  Simmonds ................. 179/175.3 F X
4,173,736  11/1979  Adams ................................... 324/51

Primary Examiner—Stafford D. Schreyer
Attorney, Agent, or Firm—Harris, Kern, Wallen & Tinsley

[57] ABSTRACT

Method and apparatus for testing pairs of conductors of a telephone cable, including method and apparatus for measuring the capacitance of a circuit component such as a pair of conductors. The capacitance of each of twenty-five pairs of conductors of a cable is measured and the capacitance value is stored, the median value of capacitance is identified and stored, each measured capacitance value is compared with the median value, and an out-of-limits indication is made when a measured capacitance value deviates from the median value by more than a predetermined limit. Capacitance is measured by connecting the circuit component, such as a pair of conductors, in the timing circuit of a monostable multivibrator, charging and discharging the timing circuit to vary the elapsed time of the on output of the multivibrator. The multivibrator controls the output of an oscillator and the oscillator output pulses are counted, with the count total varying as a function of the capacitance of the conductor pair. The instrument may be calibrated to read out directly in capacitance if desired.

16 Claims, 6 Drawing Figures

TELEPHONE CABLE SPLICERS TEST SET AND METHOD OF TESTING

BACKGROUND OF THE INVENTION

This invention relates to method and apparatus for testing pairs of conductors of a telephone cable and the like, and to method and apparatus for measuring capacitance of circuit components such as conductor pairs. The invention is especially adapted for use in testing telephone cable splices.

A typical telephone cable is divided into groups of twenty-five pairs of conductors, usually with splicing, testing and the like being performed on twenty-five pairs at a time. Various abnormal conditions may exist in the cable such as shorts, splits, hot lines, open lines, crosses, and grounds. One mode of determining the existence of such faults in the past has been to measure the capacitance of each of the twenty-five pairs, arbitrarily select one of the pairs as a standard or reference, and compare the measured capacitance of each pair with this arbitrarily selected reference pair. If the difference exceeds a predetermined limit, then the pair outside the limit is considered to have a fault and further testing is performed to identify the type and location of the fault. However there is an inherent problem in this mode of testing which arises when the arbitrarily selected reference pair itself has a fault or is at one extreme or the other of the acceptable condition. Then erroneous fault indications are obtained and faulty pairs are not identified. This type of testing cannot be accomplished by utilizing a specific capacitance value selected in advance, because the normal capacitance value for a conductor pair of a cable varies with the length and installation conditions of the particular cable. The actual length of the cable usually is not known.

It has been suggested that in lieu of arbitrarily selecting a pair as a reference for the capacitance comparison, that the average value of all the measured capacitance values be utilized. However this approach is not satisfactory because the average value will change as a function of the number of faults present in the cable, again leading to erroneous indications.

Accordingly, it is an object of the present invention to provide new and improved method and apparatus for testing a telephone cable or the like having a plurality of pairs of conductors. A further object is to provide such method and apparatus wherein the capacitance value of each pair of conductors is measured, after which the median value of capacitance is selected and used as the reference value for comparison with each of the measured values, with pairs having capacitance values outside predetermined limits being indicated as having a fault.

It is another object of the invention to provide new and improved method and apparatus for measuring the capacitance of a circuit component such as a conductor pair. An additional object is to provide such method and apparatus utilizing the circuit component in the timing circuit of a multivibrator for controlling an oscillator output, with the oscillator output being counted resulting in a digital value which is directly related to capacitance. An additional object is to provide such method and apparatus wherein the circuit component is charged and discharged, with the elapsed time for charge or discharge being measured to provide the digital output indicative of capacitance.

Other objects, advantages, features and results will more fully appear in the course of the following description.

SUMMARY OF THE INVENTION

A method for testing a telephone cable having a plurality of pairs of conductors including measuring the capacitance of each pair to provide a plurality of capacitance values, storing each of the capacitance values, selecting the capacitance value having the median value, storing the median value, and comparing each of the capacitance values with the median value and indicating if the difference between the capacitance value and the median value exceeds a predetermined level.

A method of measuring the capacitance of a circuit component such as a pair of conductors of a telephone cable, including charging and discharging a circuit component, and measuring the elapsed time for charging or discharging, with the elapsed time varying as a function of the capacitance of the circuit component. More specifically, sequentially connecting each circuit component in the timing circuit of a monostable multivibrator, with the duration of the on period of the multivibrator varying as a function of the capacitance of the connected component, gating or keying the output of an oscillator on for a time corresponding to the on period of the multivibrator, counting the output pulses of the oscillator with the count at the end of the on period varying as a function of the capacitance of the connected component, storing each of the counts to provide a plurality of capacitance values, selecting the capacitance value having the median value, storing the median value, and comparing each of the capacitance values with the median value and indicating when the difference exceeds a predetermined level.

Apparatus for performing the methods, including means for measuring the capacitance of each pair of a plurality of pairs of conductors, means for storing the plurality of capacitance values, means for selecting the median value, means for storing the median value, a comparator for comparing each of the capacitance values with the median value, and means for providing limits for the comparison.

Capacitance measuring apparatus including means for charging the circuit component, means for discharging the circuit component, and means for measuring the elapsed time for charge or discharge which elapsed time varies as a function of the capacitance. More specifically, a monostable multivibrator with the circuit component connected in the timing circuit of the multivibrator to vary the on period as a function of the capacitance of the circuit component, an oscillator, and a counter, with the multivibrator controlling the oscillator output to the counter, and with the counter output providing a digital measure of the capacitance.

DESCRIPTION OF THE PREFERRED EMBODIMENT

Figure 1:
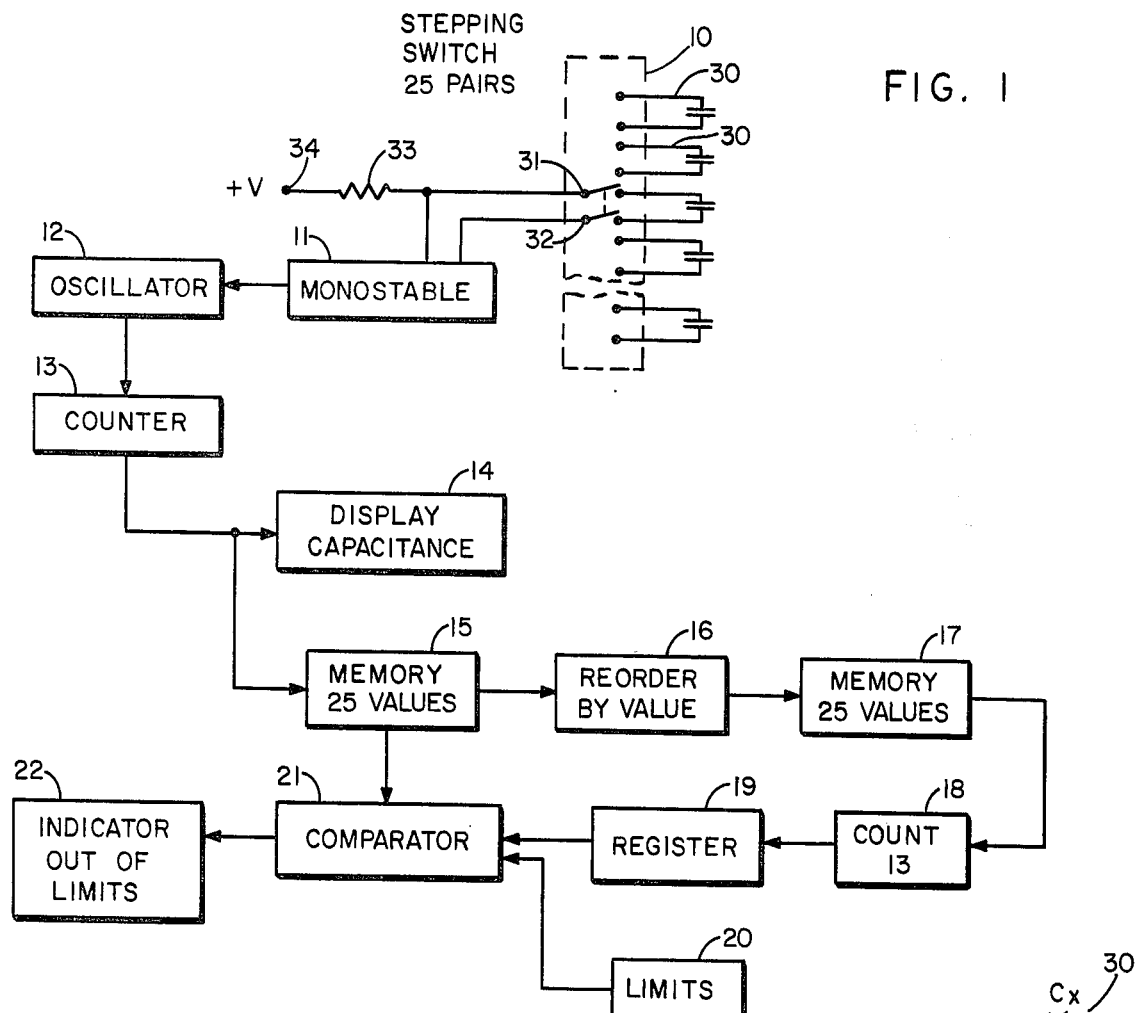
FIG. 1 is an electrical block diagram of a telephone cable test apparatus illustrating the presently preferred embodiment of the invention.

The apparatus of FIG. 1 includes a stepping switch 10, a monostable multivibrator 11, an oscillator 12, a counter 13, a display unit 14, a memory 15, an order unit 16, another memory 17, another counter 18, a storage register 19, a limit source 20, a comparator 21, and an out-of-limits indicator 22.

The stepping switch 10 may be mechanical or electronic as desired, and provides for connecting each of a plurality of pairs of conductors 30 in sequence to switch output terminals 31, 32. Each of the pairs 30 comprises a circuit component, the capacitance of which is to be measured. In a typical telephone cable, the circuit component comprises two conductors in the cable intended for carrying a telephone message.

The switch 10 provides for connecting each of the pairs 30 in series with a resistance 33 between a voltage or potential source at terminal 34 and an input to the multivibrator 11, with the resistance 33 and the capacitance of the pair 30 serving as the timing circuit or at least a portion of the timing circuit of the multivibrator 11.

Figure 2:
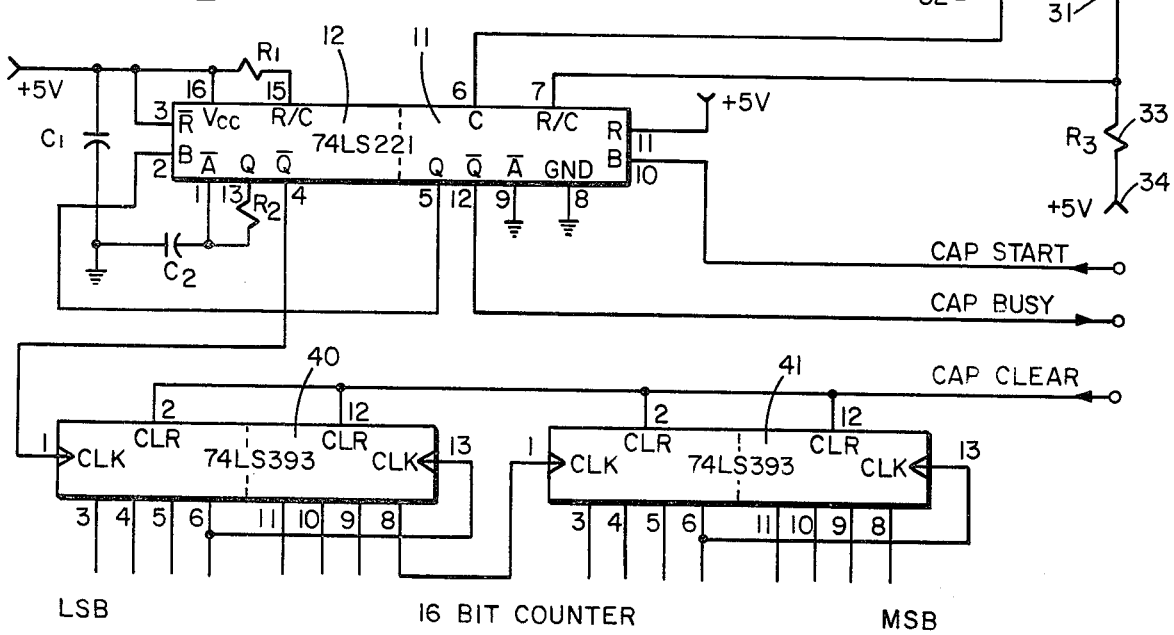
FIG. 2 is a circuit diagram showing the capacitance measuring portion of the apparatus of FIG. 1.

A preferred configuration for the multivibrator 11, oscillator 12 and counter 13 is shown in FIG. 2, where components corresponding to those of FIG. 1 are identified by the same reference numeral. The monostable multivibrator 11 is one portion of an integrated circuit which may be a 74LS221. The oscillator 12 utilizes the other portion of the integrated circuit along with resistors R1 and R2, and capacitors C1 and C2. The counter 13 is formed of two integrated circuits 40, 41, each a 74LS393 which are connected as a 16 bit counter, with the least significant bit at the left and the most significant bit at the right.

In operation, a conductor pair 30 is connected in series with the resistor 33 and the conductor pair is charged from the source 34. A start signal then causes the multivibrator to switch to an on state and discharge the conductor pair, this occurring within the integrated circuit. The conductor pair is then again charged from the source 34 through the resistor 33. When the charge of the conductor pair reaches a level as determined by the integrated circuit, the on period is terminated and the multivibrator is again in the off period. The multivibrator then awaits another start signal for repeating the cycle. Alternatively the discharge time of the timing circuit may be used to control the duration of the timing circuit.

The oscillator is operating at a frequency controlled by the circuit components, including the resistor 33 which may be adjusted to set the desired oscillator frequency. When the multivibrator switched to the one condition, the oscillator is keyed on, with the oscillator output connected from terminal 4 of the oscillator to terminal 1 of the counter circuit 40. The oscillator is keyed off during the off period. The oscillator output pulses during the on period are counted by the counter and the count state of the counter is transferred to the memory 15 after the oscillator output is terminated. Rather than keying the oscillator on and off, the oscillator could be run continuously, with the oscillator output connected to the counter during the on period and disconnected during the off period, if desired.

The digital count of the oscillator output pulses stored in the memory 15 provides a direct measure of the capacitance of the conductor pair connected at the terminals 31, 32. If desired, the count state of the counter at the end of the counting period can be displayed directly in the unit 14, or can be converted to read directly in capacitance or in feet to the fault, by simple computation, and displayed at the unit 14. Similarly, the digital count can be utilized directly in the memory 15 and subsequent components or can be converted to a digital capacitance number or other representation, as desired. In either event, the digital data directly represents a capacitance value.

The capacitance of each pair may be measured once. However for improved accuracy it is preferred to repeat the capacitance measurement of a pair a number of times and average the measurements to obtain a capacitance value for display at 14 and/or storage in memory 15.

After the capacitance has been measured for each of the pairs and the digital figure representing capacitance has been stored in the memory 15, the median capacitance value is selected. This may be accomplished by placing the twenty-five capacitance values in an order based on the magnitude of the values, with the values ranging from lowest to highest or highest to lowest, as desired. This is accomplished in the order unit 16 of the diagram of FIG. 1. The ordered capacitance values are then stored in memory 17 in the ordered sequence. The median value is then obtained by counting to the midpoint of the order, the thirteenth value in the example given, utilizing the counter 18. This thirteenth or median capacitance value is stored in the register 19 for use as a reference in the comparator 21.

Then each of the measured capacitance values from the memory 15 (or from the memory 17 if desired) is compared with the reference or median value from the register 19 and the difference is noted. This difference is compared with a preset limit from the limit unit 20 and if the actual difference is greater than the preset limit, a signal is sent to the indicator 22 which indicates and/or records that the capacitance of the particular pair is outside the limit. Usually the limit is set as a percentage of the median value since the actual magnitude of the median value is not known in advance. By way of example, a limit for a plastic insulated cable may be ±9.1% and for a pulp cable may be ±14.3%.

Figure 3:
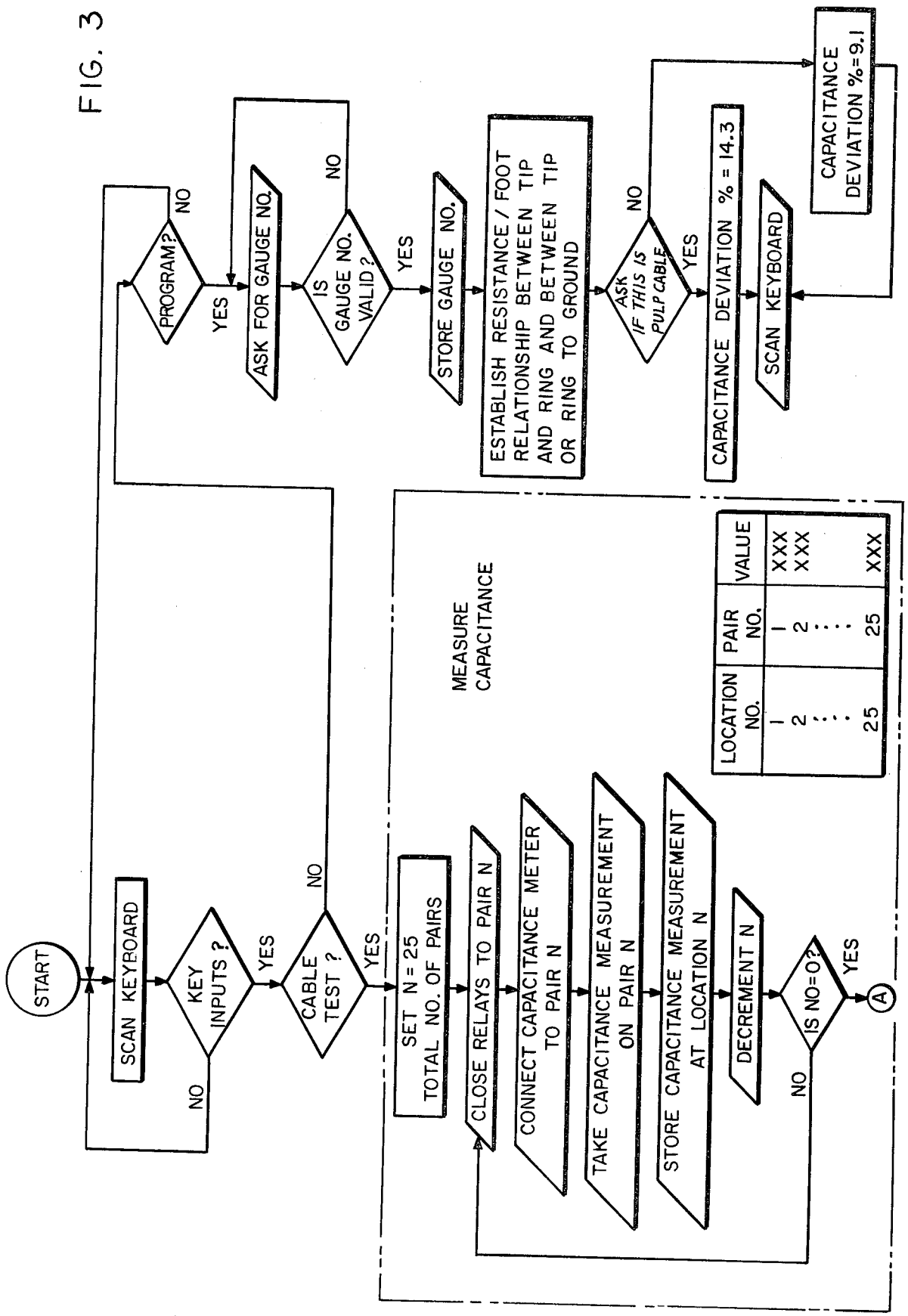
FIGS. 3, 4, 5 and 6 are four sections of a flow chart illustrating the operation of the apparatus of FIG. 1.
Figure 4:
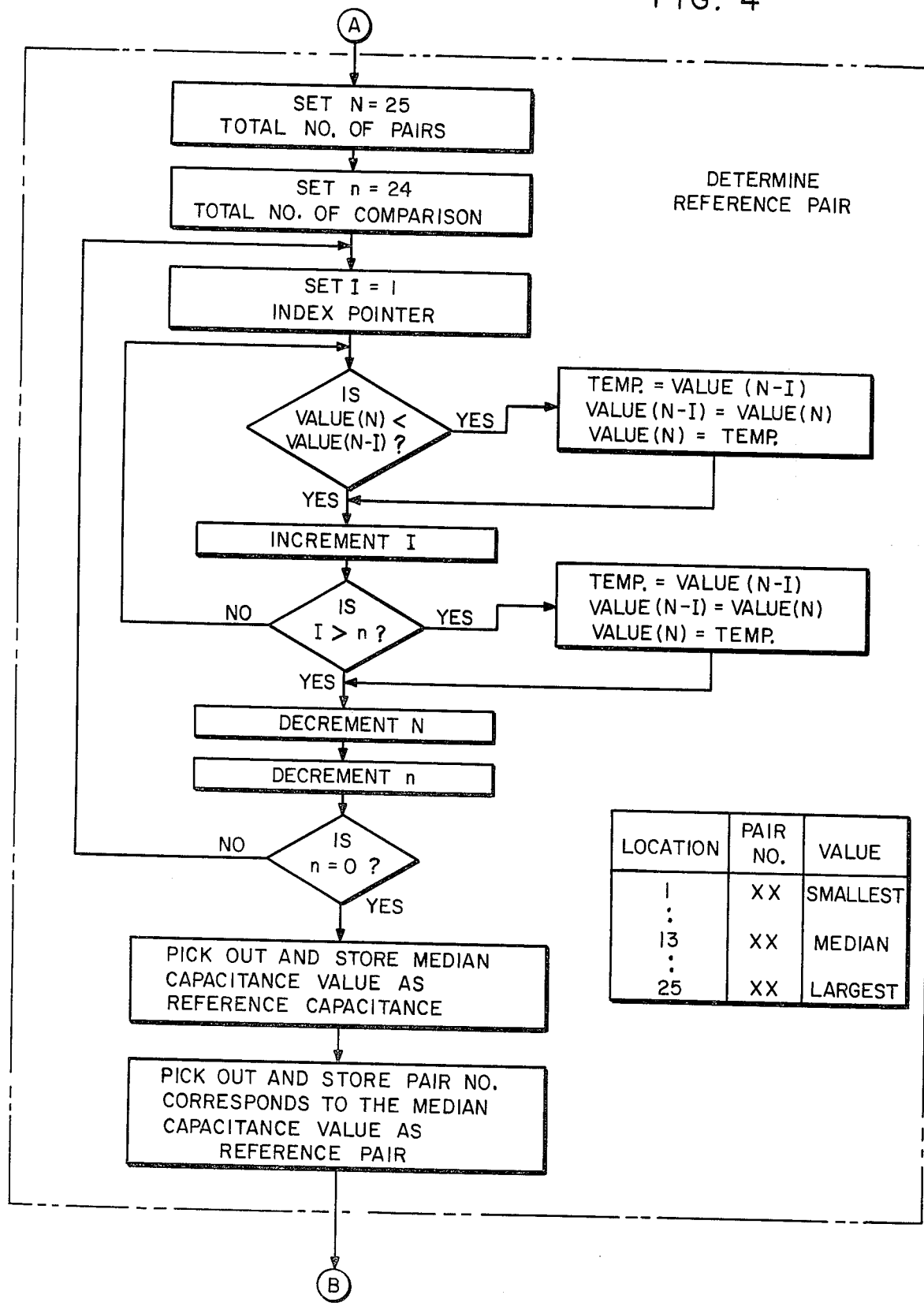
Figure 5:
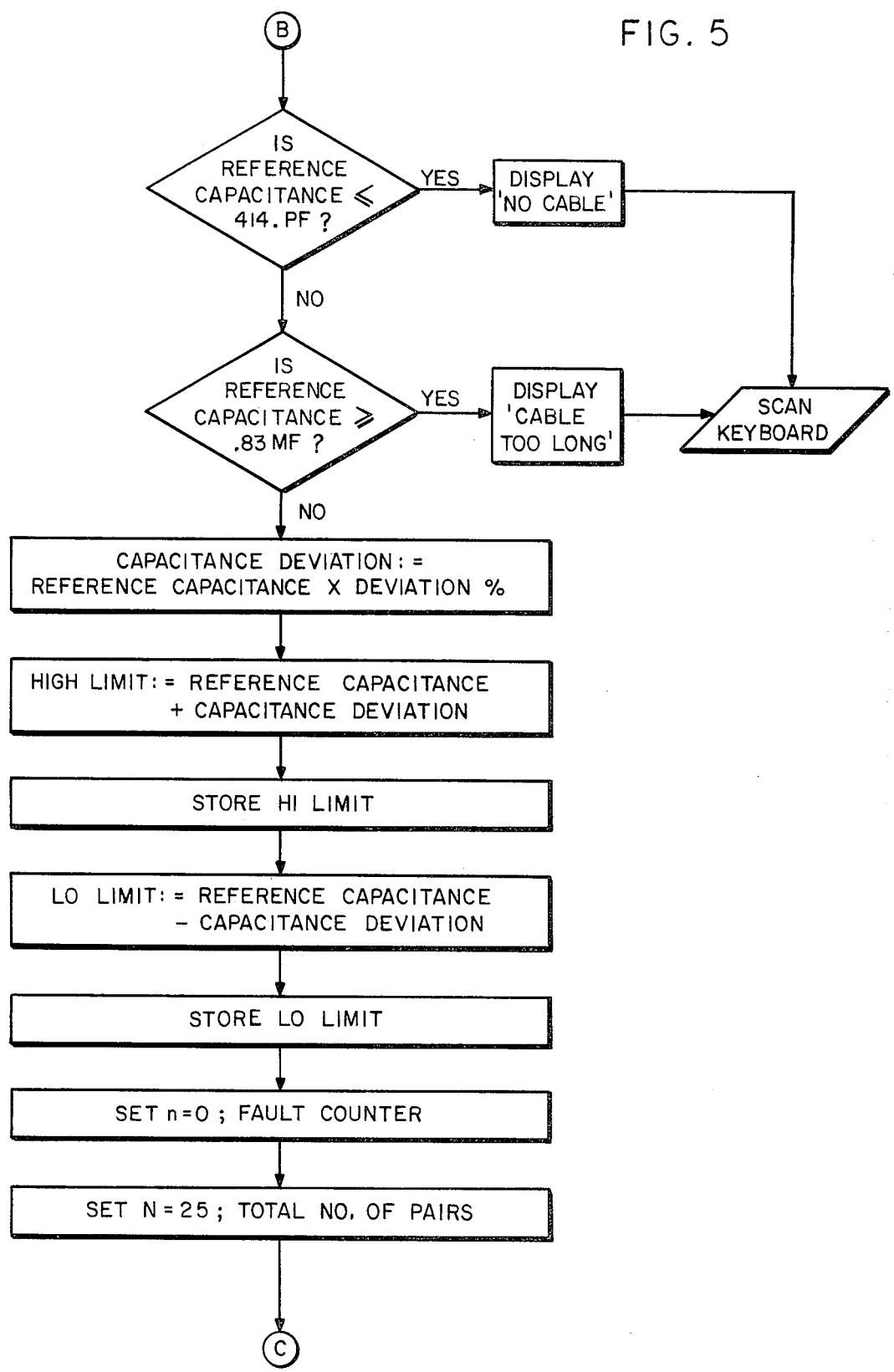
Figure 6:
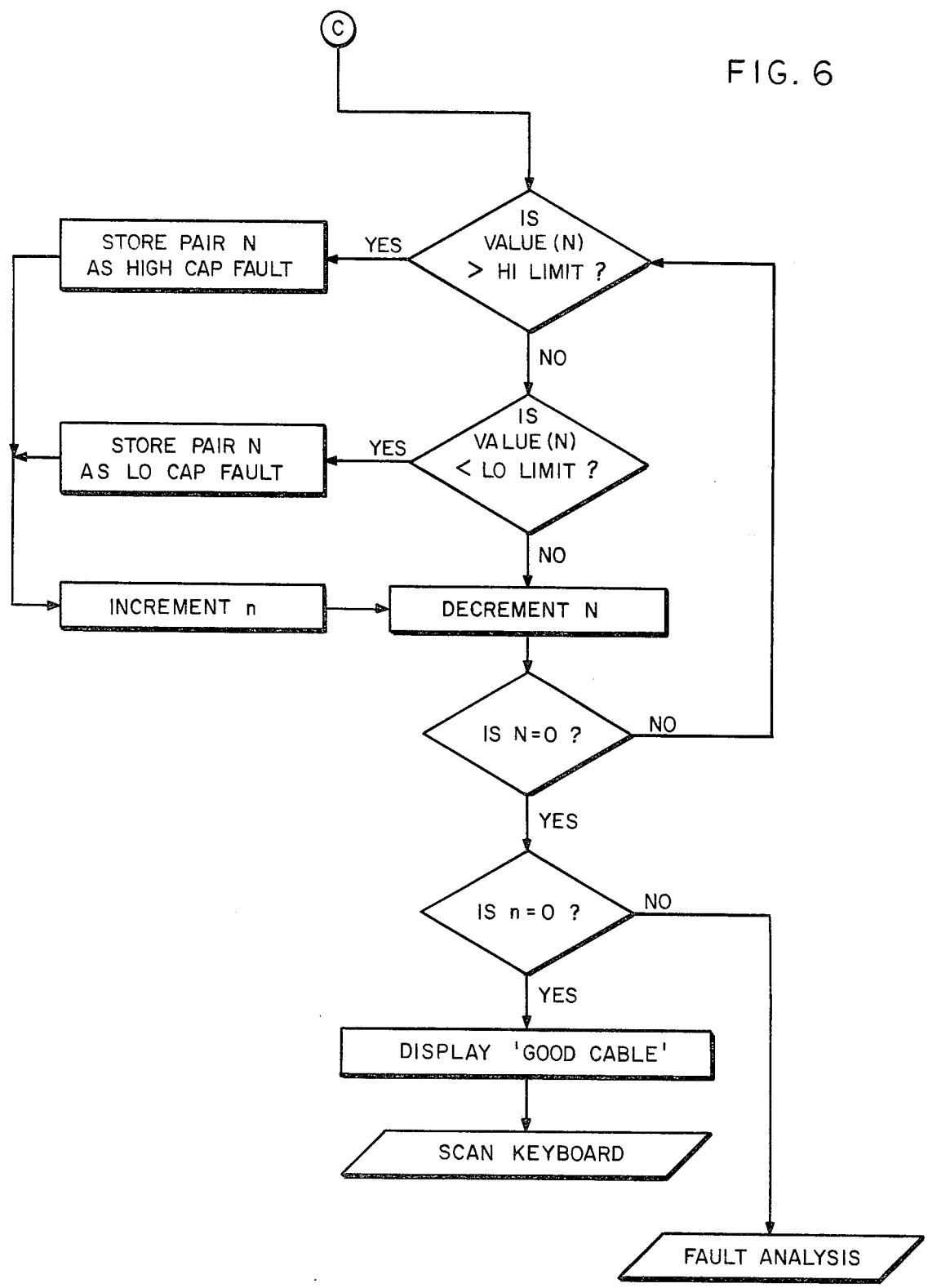

The apparatus of the invention has been illustrated in block diagram form in FIG. 1. The preferred embodiment utilizes a microprocessor for performing the various steps of the invention, and a flow chart for the microprocessor is shown in FIGS. 3–6. In FIG. 3, the right-hand portion sets out the steps for initially determining the limits. The left-hand portion sets out the steps for the capacitance measurement. FIG. 4 sets out the steps in determining which pair of conductors is to be utilized as the reference pair, that is, the selection of the median value of the measured capacitance values. FIG. 5 sets out the steps in determining the actual values for the limits, that is, using the predetermined limit percentages and the actual digital figure of the selected median capacitance value to obtain digital figures for use in the comparison. FIG. 6 sets out the steps in performing the actual comparison. The term "fault analysis" appearing at the lower right of FIG. 6 refers to subsequent steps, not a part of the present invention, which determine the particular type of fault existing in the conductor pair.

I claim:

1. In an apparatus for measuring the capacitance of a circuit component, the combination of:

a monostable multivibrator having on and off outputs and having a timing circuit for varying the duration of said on output;

means for connecting a circuit component, the capacitance of which is to be measured, in said timing circuit, with the duration of said on output varying as a function of the capacitance of the circuit component;

an oscillator providing output pulses at an output;

a counter having an input and an output; and means for connecting said oscillator output to said counter input during said multivibrator on output for counting oscillator output pulses during said on output, with the counter output at the end of said on output varying as a function of the capacitance of the circuit component.

2. Apparatus as defined in claim 1 including display means for displaying a value indicating the capacitance of the circuit component, and means for connecting said counter output to said display means as an input.

3. Apparatus as defined in claim 1 wherein said means for connecting includes switch means for sequentially connecting each of a plurality of pairs of terminals in said timing circuit, whereby circuit components connected to said pairs of terminals may have the capacitances thereof measured in sequence.

4. Apparatus as defined in claim 3 including:

first means for storing each of said counter outputs obtained in sequence to provide a plurality of capacitance values;

means for connecting said counter output to said first storing means;

means for selecting the capacitance value having the median value of the plurality of capacitance values;

means for connecting said first storage means to said selecting means;

second means for storing said median value;

means for connecting said selecting means to said second storing means;

compartor means for comparing each of said plurality of capacitance values with said median value and indicating if the difference between the capacitance value and median value exceeds a predetermined limit;

means for providing a predetermined limit to said comparator means; and means for connecting said first and second storing means to said comparator means.

5. Apparatus as defined in claim 4 wherein said means for selecting includes means for arranging said plurality of capacitance values in an order based on the magnitude of the values, and means for choosing the midpoint of said order.

6. In an apparatus for measuring the capacitance of a circuit component, the combination of:

means for charging a circuit component, the capacitance of which is to be measured, to a predetermined potential;

means for discharging the charged circuit component;

means for determining the occurrence of one of charging and discharging the circuit component, with said occurrence varying as a function of the capacitance of the circuit component;

said means for charging including switch means for sequentially charging each of a plurality of circuit components to provide a pluraliy of determinations, whereby the circuit components may have the capacitances thereof measured in sequence; and first means for storing values representing each of said determinations to provide a plurality of capacitance values;

means for connecting said determining means to said first storing means;

means for selecting the capacitance value having the median value of the plurality of capacitance values;

means for connecting said first storing means to said selecting means;

second means for storing said median value;

means for connecting said selecting means to said second storing means;

comparator means for comparing each of said plurality of capacitance values with said median value and indicating if the difference between the capacitance value and the median value exceeds a predetermined limit;

means for providing a predetermined limit to said comparator means; and means for connecting said first and second storing means to said comparator means.

7. In an apparatus for testing a telephone cable having a plurality of pairs of conductors, the combination of:

means for measuring the capacitance of each pair of a plurality of pairs of conductors to provide a plurality of capacitance values;

first means for storing each of said plurality of capacitance values;

means for connecting said measuring means to said first storing means;

means for selecting the capacitance value having the median value of the plurality of capacitance values;

means for connecting said first storing means to said selecting means;

second means for storing said median value;

means for connecting said selecting means to said second storing means;

comparator means for comparing each of said plurality of capacitance values with said median value and indicating if the difference between the capacitance value and median value exceeds a predetermined limit;

means for providing a predetermined limit to said comparator means; and means for connecting said first and second storing means to said comparator means.

8. In an apparatus for testing a telephone cable having a plurality of pairs of conductors, the combination of:

a monostable multivibrator having on and off outputs and having a timing circuit for varying the duration of said on output;

means for sequentially connecting each of a plurality of pairs of conductors in said timing circuit, with the duration of said on output varying as a function of the capacitance of the connected pair;

an oscillator providing output pulses at an output;

a counter having an input and an output;

means for connecting said oscillator output to said counter input during said multivibrator on output for counting oscillator output pulses during said on output, with the counter output at the end of said on output varying as a function of the capacitance of the connected pair;

first means for storing each of said counter outputs obtained in sequence to provide a plurality of capacitance values;

means for connecting said counter output to said first storing means;

means for selecting the capacitance value having the median value of the plurality of capacitance values;

means for connecting said first storing means to said selecting means;

second means for storing said median value;

means for connecting said selecting means to said second storing means;

comparator means for comparing each of said plurality of capacitance values with said median value and indicating if the difference between the capacitance value and median value exceeds a predetermined limit;

means for providing a predetermined limit to said comparator means; and means for connecting said first and second storing means to said comparator means.

9. In a method of measuring the capacitance of a circuit component, the steps of:

connecting a circuit component, the capacitance of which is to be measured, in the timing circuit of a monostable multivibrator having an on period and an off period, with the duration of the on period varying as a function of the capacitance of the circuit component;

gating the output of an oscillator on for a time corresponding to the on period of the multivibrator; and counting the output pulses of the oscillator, with the count at the end of the on period varying as a function of the capacitance of the circuit component.

10. The method as defined in claim 9 including converting the count to a capacitance value, and displaying the capacitance value.

11. The method as defined in claim 9 including sequentially connecting each of a plurality of circuit components in the timing circuit and repeating the measuring steps to provide a plurality of counts to obtain a measur of each of the circuit components.

12. The method as defined in claim 11 including:

storing each of the counts to provide a plurality of capacitance values;

selecting the capacitance value having the median value of the plurality of capacitance values;

storing the median value; and comparing each of the plurality of capacitance values with the median value and indicating if the difference between the capacitance value and median value exceeds a predetermined limit.

13. The method as defined in claim 12 wherein the selecting step is performed by placing the plurality of capacitance values in an order based on the magnitude of the values, and choosing the value at the midpoint of the order as the median value.

14. In a method of measuring the capacitance of a circuit component, the steps of:

charging a circuit component, the capacitance of which is to be measured, to a predetermined potential;

discharging the charged circuit component;

determining the occurrence of one of charging and discharging, which occurrence varies as a function of the capacitance of the circuit component;

repeating the steps for each of a plurality of circuit components to provide a plurality of determinations to measure the capacitance of the circuit components in sequence;

storing values representing each of the determinations to provide a plurality of capacitance values;

selecting the capacitance value having the median value of the plurality of capacitance values;

storing the median value; and comparing each of the plurality of capacitance values with the median value and indicating if the difference between the capacitance value and median value exceeds a predetermined limit.

15. In a method for testing a telephone cable having a plurality of pairs of conductors, the steps of:

measuring the capacitance of each pair of a plurality of pairs of conductors to provide a plurality of capacitance values;

storing each of the plurality of capacitance values;

selecting the capacitance value having the median value of the plurality of capacitance values;

storing the median value; and comparing each of the plurality of capacitance values with the median value and indicating if the difference between the capacitance value and median value exceeds a predetermined level.

16. In a method for testing a telephone cable having a plurality of pairs of conductors, the steps of:

sequentially connecting each pair of conductors in the timing circuit of a monostable multivibrator having an on period and an off period, with the duration of the on period varying as a function of the capacitance of the connected pair;

gating the output of an oscillator on for a time corresponding to the on period of the multivibrator;

counting the output pulses of the oscillator, with the count at the end of the on period varying as a function of the capacitance of the connected pair;

storing each of the counts to provide a plurality of capacitance values;

selecting the capacitance value having the median value of the plurality of capacitance values;

storing the median value; and comparing each of the plurality of capacitance values with the median value and indicating if the difference between the capacitance value and median value exceeds a predetermined limit.

* * * * *